United States Patent
Aoki et al.

(10) Patent No.: US 9,293,296 B2
(45) Date of Patent: Mar. 22, 2016

(54) ELECTROMAGNET SUPPORT FRAME

(71) Applicants: Ryusuke Aoki, Tokyo (JP); Jun Obata, Tokyo (JP)

(72) Inventors: Ryusuke Aoki, Tokyo (JP); Jun Obata, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/759,010

(22) PCT Filed: Mar. 14, 2013

(86) PCT No.: PCT/JP2013/057194
§ 371 (c)(1),
(2) Date: Jul. 2, 2015

(87) PCT Pub. No.: WO2014/141433
PCT Pub. Date: Sep. 18, 2014

(65) Prior Publication Data
US 2015/0348739 A1 Dec. 3, 2015

(51) Int. Cl.
*H01F 7/126* (2006.01)
*H01J 37/147* (2006.01)
*F16M 11/04* (2006.01)
*H05H 7/04* (2006.01)

(52) U.S. Cl.
CPC ............ *H01J 37/147* (2013.01); *F16M 11/045* (2013.01); *F16M 11/046* (2013.01); *H05H 7/04* (2013.01); *H01J 2237/152* (2013.01); *H05H 2007/048* (2013.01)

(58) Field of Classification Search
CPC .... H01J 37/147; H01J 2237/152; H05H 7/04; H05H 2007/048
See application file for complete search history.

(56) References Cited

U.S. PATENT DOCUMENTS

| | | | | |
|---|---|---|---|---|
| 5,528,212 | A * | 6/1996 | Challenger | H05H 7/04 335/212 |
| 7,956,557 | B1 * | 6/2011 | Waterman | H05H 7/04 315/501 |
| 7,986,205 | B2 * | 7/2011 | Horisaka | A61B 1/041 324/319 |
| 8,476,602 | B2 * | 7/2013 | Nicolaescu | G21K 1/093 250/396 ML |
| 8,884,256 | B2 * | 11/2014 | Sugahara | H05H 7/08 250/396 ML |
| 2007/0273464 | A1 | 11/2007 | Kitahara et al. | |
| 2014/0176270 | A1 * | 6/2014 | Temnykh | H01S 3/0903 335/306 |

FOREIGN PATENT DOCUMENTS

| | | |
|---|---|---|
| JP | 01-155700 U | 10/1989 |
| JP | 04-65100 A | 3/1992 |
| JP | 06-36896 A | 2/1994 |
| JP | 2006-302818 A | 11/2006 |
| JP | 2007-149405 A | 6/2007 |
| JP | 2007-261739 A | 10/2007 |
| JP | 2009-217938 A | 9/2009 |
| JP | 2010-144368 A | 7/2010 |

OTHER PUBLICATIONS

International Search Report (PCT/ISA/210) mailed on Jun. 18, 2013, by the Japanese Patent Office as the International Searching Authority for International Application No. PCT/JP2013/057194.
* cited by examiner

*Primary Examiner* — Bradley Duckworth
(74) *Attorney, Agent, or Firm* — Buchanan Ingersoll & Rooney PC

(57) ABSTRACT

The electromagnet support frame is for supporting an electromagnet having a trunnion pair which comprises two trunnions that are formed on mutually opposite side-faces of the electromagnet and whose central axes are matched to each other, and is characterized by including support fixtures whose number is the same as that of the trunnions and in which engaging parts are formed that are engaged with the trunnions so as to cover outer faces thereof, and a mounting frame that holds the support fixtures through vertical adjustment parts that move the fixtures in a vertical direction.

13 Claims, 9 Drawing Sheets

ELECTROMAGNET SUPPORT FRAME

TECHNICAL FIELD

The present invention relates to an electromagnet support frame for supporting a large-size electromagnet that is utilized in an accelerator, a beam transport system or the like used in, for example, research, medical and industrial fields.

BACKGROUND ART

In general, a particle beam therapy system used for cancer therapy or the like includes: a beam generation apparatus that generates a charged particle beam; an accelerator that is connected to the beam generation apparatus and accelerates the generated charged particle beam; a beam transport system that transports the charged particle beam emitted from the accelerator after being accelerated thereby up to a preset energy; and a particle beam irradiation apparatus that is placed downstream of the beam transport system, for radiating the charged particle beam to an irradiation subject. In order to radiate the charged particle beam to the irradiation subject at an arbitrary angle, the particle beam irradiation apparatus is placed in a rotary gantry for three-dimensional irradiation.

Charged particles formed into a beam (referred to also as the charged particle beam or a particle beam) that is obtained by circularly accelerating the charged particles by the accelerator (circular accelerator) such as a synchrotron, etc. and taking out the charged particles (protons, carbon ions, etc.) accelerated up to a high energy from its circular trajectory, are transported using the beam transport system so as to be applied to a physical experiment in which an intended object is irradiated therewith or a particle beam therapy such as a cancer therapy, etc. In the cancer therapy by the accelerated charged particles, that is, in the particle beam therapy, in order to keep vital organs away or to prevent normal tissues from being affected at the time of the therapy, changing a direction of the irradiation is generally performed. In order to irradiate the patient from an arbitrary direction, the particle beam irradiation apparatus placed in the aforementioned rotary gantry is used.

The accelerator such as a synchrotron, etc. is configured with: a circular acceleration tube in which the charged particle beam circulates; deflection electromagnets and four-pole electromagnets for controlling the circular trajectory of the charged particle beam; an acceleration cavity that accelerates the charged particle beam using an electric field generated by a high-frequency acceleration voltage; an injection device that introduces the charged particle beam into the acceleration tube; an emission device that takes out the accelerated charged particle beam to the outside; and so on. In order for the charged particle beam to circulate without colliding with the acceleration tube, an alignment that is an adjustment of position, angle, etc. is applied to the deflection electromagnets, the four-pole electromagnets and the like. Further, with respect also to the beam transport system, an alignment that is an adjustment of position, angle, etc. is applied thereto in order for the charged particle beam to be transported to the particle beam irradiation apparatus without colliding with the transport tube.

For example, in Patent Document 1, there is described an alignment system of an electromagnet for a high energy accelerator in which the electromagnet for the accelerator placed on a mounting frame is adjusted in its position and attitude using pluralities of adjusting bolts and actuators. The alignment system of Patent Document 1 includes, for each one of electromagnets, four adjusting bolts for adjusting it in a horizontal direction and four adjusting bolts for adjusting it in a vertical direction, and the respective adjusting bolts are controlled by the actuators.

Meanwhile, in Patent Document 2, there is described an accelerator system in which a pre-accelerator that accelerates a charged particle beam and a synchrotron that further accelerates the charged particle beam emitted from the pre-accelerator, are sterically arranged. A beam transport means that connects the pre-accelerator and the synchrotron together is arranged vertically. Deflection electromagnets and four-pole electromagnets in the beam transport means are fixed on respective fixing plates, and the fixing plates are arranged perpendicular to the a side face of a plate-like mounting frame fixed to a shielding wall.

CITATION LIST

Patent Document

Patent Document 1: Japanese Patent Application Laid-open No. 2006-302818 (paragraphs 0016 to paragraph 0018, FIG. 1, FIG. 2)
Patent Document 2: Japanese Patent Application Laid-open No. 2009-217938 (paragraphs 0027 to paragraph 0031, FIG. 2, FIG. 3)

SUMMARY OF THE INVENTION

Problems to be Solved by the Invention

In the alignment system of Patent Document 1, since the deflection electromagnet is supported by the four adjusting bolts for adjusting it in a vertical direction, when the height of the charged particle beam is greatly different at its incident side and at its emission side, namely, the incident angle and the emission angle of the charged particle beam relative to a floor on which the accelerator is placed are different to each other, a support structure is separately required that prevents displacement of the deflection electromagnet and holds the setting angle thereof. Accordingly, the alignment system of Patent Document 1 has a problem that it is less flexible in arrangement and becomes large as an entire apparatus.

Since the accelerator system of Patent Document 2 utilizes a very large plate (mounting frame) and the fixing plates for fixing the deflection electromagnets and the four-pole electromagnets in the vertically-arranged beam transport means, it is complicated and less in open-space, so that there is a problem such as that the installation place is largely restricted with respect to the arrangement of cables for feeding electricity to the deflection electromagnets and the four-pole electromagnets, and with respect also to the arrangement of cooling water piping for cooling these electromagnets.

The present invention is purported to provide an electromagnet support frame for supporting a large-size electromagnet, which is highly flexible in arrangement of the large-size electromagnet and can be made compact as an entire apparatus.

Means for Solving the Problems

An electromagnet support frame according to the invention is for supporting an electromagnet that has a trunnion pair which comprises two trunnions that are formed on mutually opposite side-faces of the electromagnet and whose central axes are matched to each other, and is characterized by including: support fixtures whose number is the same as that of the trunnions and in which engaging parts are formed that are engaged with the trunnions so as to cover outer faces thereof; and a mounting frame that holds the support fixtures through vertical adjustment parts that move the fixtures in a vertical direction.

Further, another electromagnet support frame according to the invention is for supporting an electromagnet that has an engaging-part pair which comprises engaging parts provided as two recesses that are formed on mutually opposite side-faces of the electromagnet and whose central axes are matched to each other, and is characterized by including: support fixtures whose number is the same as that of the engaging parts and in which trunnions are formed that are engaged with the engaging parts so that outer surfaces of the trunnions are inserted therein; and a mounting frame that holds the support fixtures through vertical adjustment parts that move the fixtures in a vertical direction.

Effect of the Invention

In accordance with the electromagnet support frame according to the invention, since the electromagnet is supported using the trunnions and the engaging parts engaged with the trunnions, flexibility in arrangement of a large-size electromagnet is high, so that it can be made compact as an entire apparatus.

MODES FOR CARRYING OUT THE INVENTION

Embodiment 1

Figure 1:
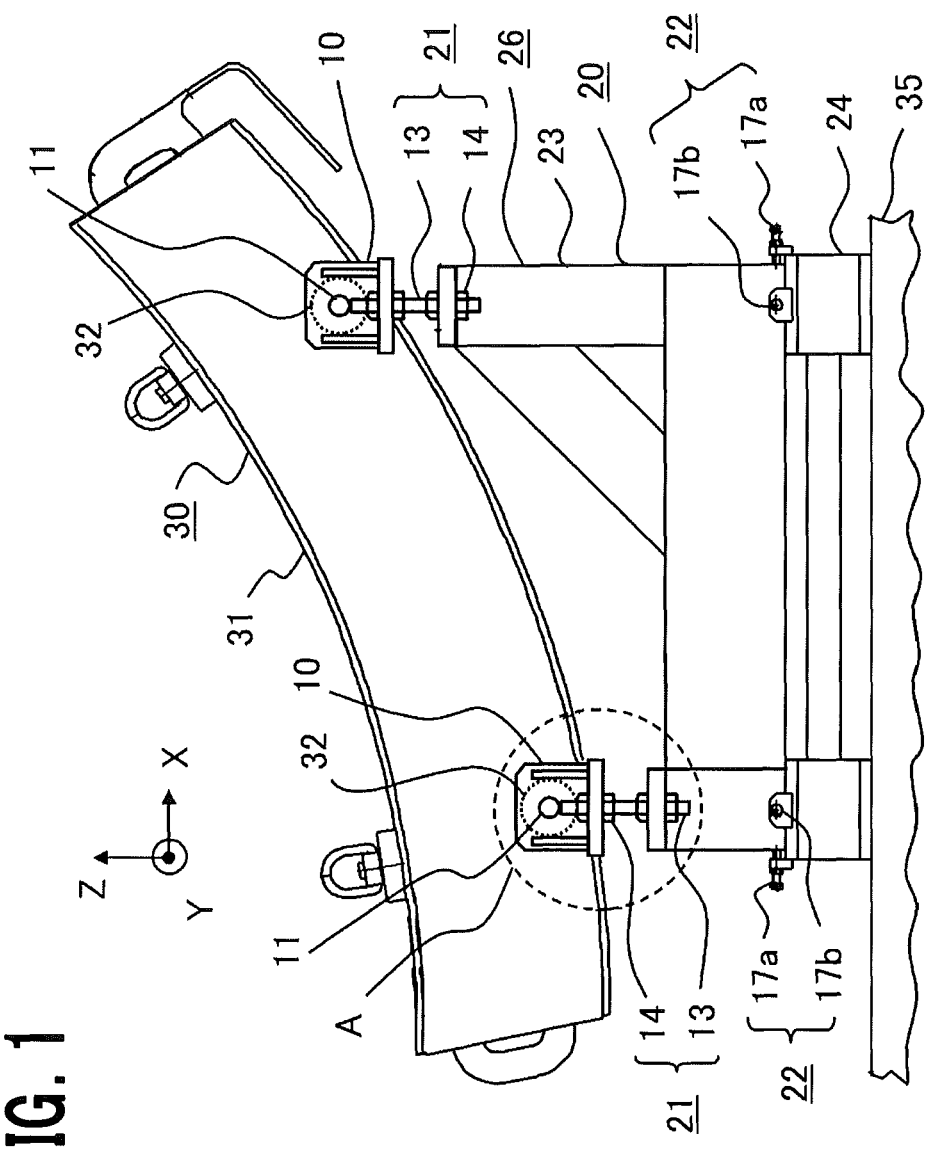
FIG. 1 is a diagram showing an electromagnet support frame according to Embodiment 1 of the invention.
Figure 2:
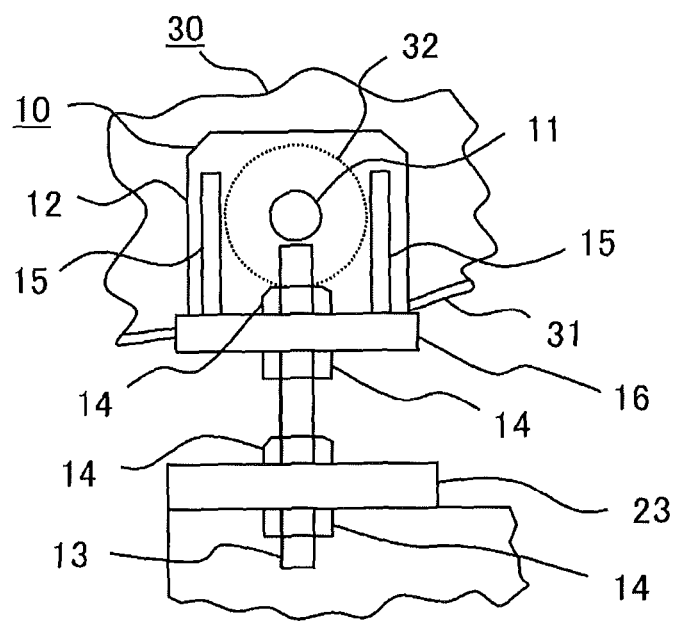
FIG. 2 is an enlarged view of a portion A in FIG. 1.
Figure 3:
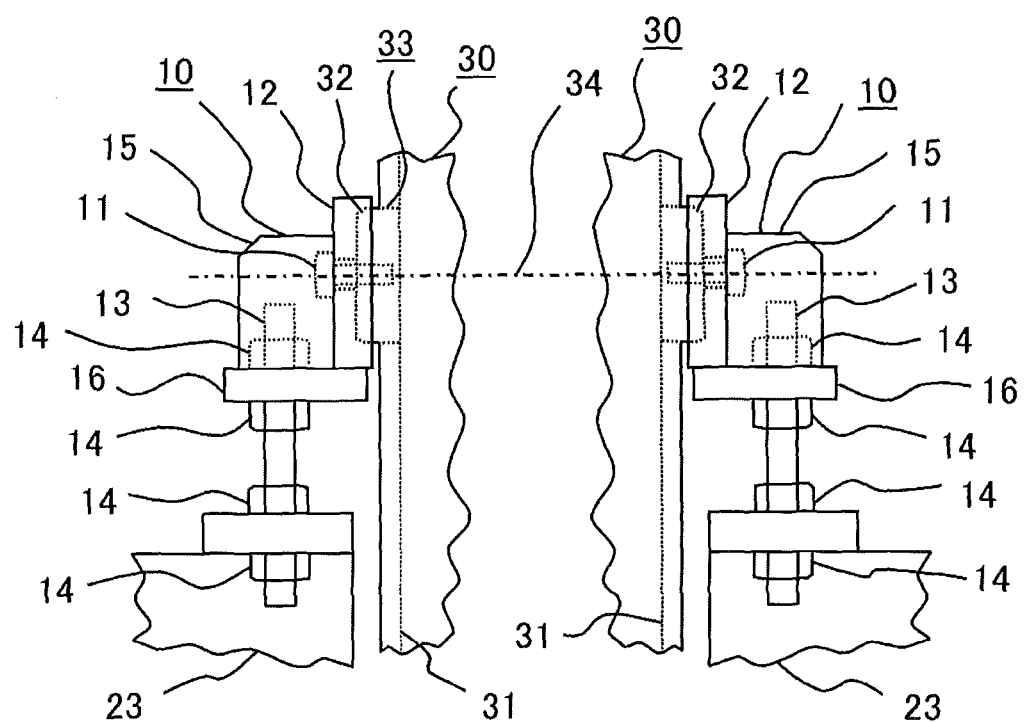
FIG. 3 is a side view of the portion A in FIG. 1.
Figure 4:
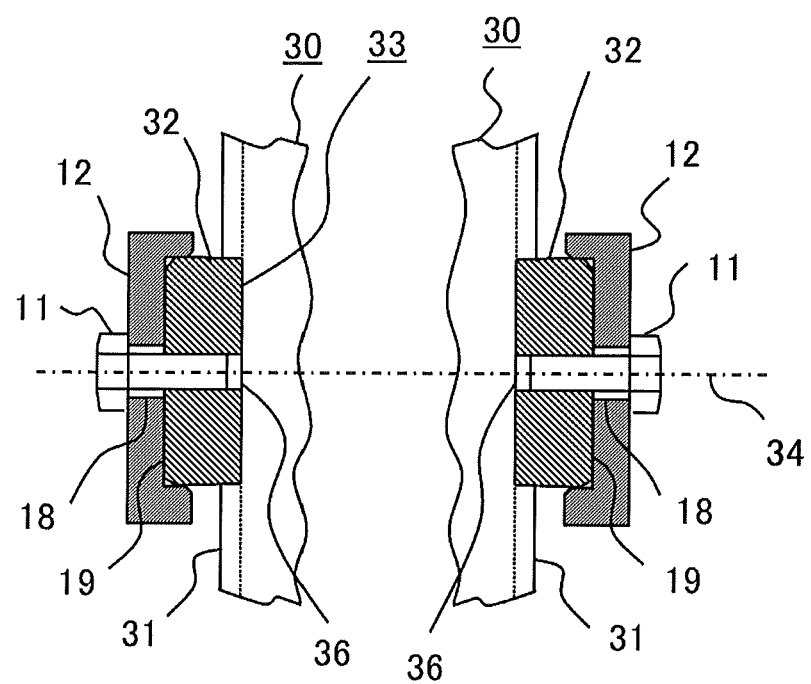
FIG. 4 is a diagram showing an engagement relationship between the electromagnet support frame and the electromagnet according to Embodiment 1 of the invention.

FIG. 1 is a diagram showing an electromagnet support frame according to Embodiment 1 of the invention. FIG. 2 is an enlarged view of a portion A in FIG. 1, and FIG. 3 is a side view of the portion A in FIG. 1. FIG. 4 is a diagram showing an engagement relationship between the electromagnet support frame and the electromagnet according to Embodiment 1 of the invention, a main-part of which is shown in cross section. An electromagnet 30 covered with an electromagnet cover 31 is supported by an electromagnet support frame 20. The electromagnet support frame 20 includes a lower mounting frame 24 placed on a floor 35, an upper mounting frame 23, a plurality of support fixtures 10 that support the electromagnet 30, horizontal adjustment parts 22 and vertical adjustment parts 21. On the electromagnet cover 31, there are provided a plurality of trunnions 32 that are engaged with the support fixtures 10. The lower mounting frame 24, the upper mounting frame 23 and the horizontal adjustment parts 22 constitute a mounting frame 26. The electromagnet 30 controls the beam path of a charged particle beam.

As shown in FIG. 3 and FIG. 4, the trunnions 32 are cylindrical protrusions and are fitted into the support fixtures 10. The trunnion 32 is supported by the support fixture 10 in a rotatable manner relative to a central axis 34 of the trunnion 32. The support frame 10 includes a base plate 16 connected to the vertical adjustment part 21, a coupling plate 12 engaged with the trunnion 32, and side plates 15 connected to the base plate 16 and the coupling plate 12. An electromagnet support frame that utilizes trunnions will be called as a trunnion-type electromagnet support frame.

The horizontal adjustment part 22 includes an adjusting bolt 17a for adjusting the position of the upper mounting frame 23 in an X-direction, and an adjusting bolt 17b for adjusting the position of the upper mounting frame 23 in a Y-direction. The vertical adjustment part 21 adjusts the position of the support fixture 10 relative to the upper mounting frame 23 in a Z-direction. The vertical adjustment part 21 includes an adjusting screw rod 13 and a nut 14.

The outer face of the trunnion 32 (circular face and cylindrical side face) is finished highly accurately. In a trunnion pair 33 provided as the two trunnions 32 each placed opposite to the electromagnet 30, the central axes 34 of the respective trunnions 32 are matched to each other. On the coupling plate 12, an engaging part 19 that is a recess engaged with the trunnion 32 is machined highly accurately. In the coupling plate 12, a through-hole 18 centering on the central axis 34 is formed, and in the trunnion 32, a screw hole 36 centering on the central axis 34 is formed. The support fixture 10 is engaged with the trunnion 32 so as to be fitted therewith, and the support fixture 10 and the trunnion 32 are coupled by a fixing bolt 11 so that they are not removed from each other. Since the through-hole 18 and the shaft of the fixing bolt 11 are not in contact with each other, a sliding motion between the outer face of the trunnion 32 and the engaging part 19 of the support fixture 10 is not affected.

How to place the electromagnet 30 will be described. The electromagnet 30 shown in FIG. 1 is provided, at right and left sides in the figure, with two trunnion pairs 33, namely, four trunnions 32. For example, the left-side trunnion pair 33 (first trunnion pair) is placed nearer to the incident side of the charged particle beam, and the right-side trunnion pair 33 (second trunnion pair) is placed nearer to the emission side of the charged particle beam. The support fixture 10 is fitted with each of the trunnions 32, and each trunnion 32 is coupled with each support fixture 10 by the fixing bolt 11. The support fixture 10 and the upper mounting frame 23 are coupled together by the adjusting screw rod 13 and the nut 14. Thereafter, the position and attitude of the electromagnet 30 is adjusted using the vertical adjustment parts 21 and the horizontal adjustment parts 22. In the example in FIG. 1, the support fixtures 10 engaged with the trunnions 32 of the first trunnion pair are made different in vertical position to the support fixtures 10 engaged with the trunnions 32 of the second trunnion pair.

Since the electromagnet support frame 20 of Embodiment 1 is of a trunnion type, even if the height of the charged particle beam is greatly different at the incident side and at the emission side, namely, the incident angle and the emission angle of the charged particle beam relative to the floor 35 on which the electromagnet 30 is placed, are different to each other, it is possible, unlike Patent Document 1, to accurately and adjustably support the electromagnet 30 without separately using a support structure that prevents displacement of the electromagnet and holds the setting angle thereof. A height in the trunnion 32 in the direction along the central axis 34 (protrusion height) can be low, and also a width in the support frame 10 engaged with the trunnion 32 in the direction along the central axis 34 can be relatively narrow, so that the trunnion 32 and the support frame 10 can be small-sized. According to the electromagnet support frame 20 of Embodiment 1, since the trunnion 32 and the support fixture 10 are small-sized, the electromagnet 30 and the electromagnet support frame 20 can be made compact as a whole.

Further, according to the electromagnet support frame 20 of Embodiment 1, since the electromagnet 30 can be supported by the trunnion 32 and the support fixture 10 that are small-sized, the very large plate and the fixing plates as in Patent Document 2 are not used around the electromagnet 30, so that it is possible to create the periphery of the electromagnet 30 as a broad open-space. According to the electromagnet support frame 20 of Embodiment 1, since an available space can be provided broadly around the electromagnet 30, it is possible to reduce restrictions with respect to the arranged position of the cable for feeding electricity to the electromagnet 30, and with respect to the arranged position of the cooling water piping for cooling the electromagnet 30, thus enhancing flexibility in arrangement of the electromagnet 30.

According to the electromagnet support frame 20 of Embodiment 1, it serves to support the electromagnet 30 having the trunnion pair 33 which comprises the two trunnions 32 provided on mutually opposite side-faces of the electromagnet and whose central axes 34 are matched to each other, and it includes: the support fixtures 10 whose number is the same as that of the trunnions 32 and in which the engaging parts 19 are formed that are engaged with the trunnions 32 so as to cover the outer faces thereof; and the mounting frame 26 that holds the support fixtures 10 through the vertical adjustment parts 21 for moving the fixtures in a vertical direction. Thus, it is highly flexible in arrangement of the large-size electromagnet, and can be made compact as an entire apparatus.

Embodiment 2

In Embodiment 1, description has been made on the case where the trunnion 32 and the support fixture 10 are coupled together using the fixing bolt 11; however, if a precision of the fitting between the outer face of the trunnion 32 and the engaging part 19 of the support fixture 10, namely, a precision of engagement is improved, the fixing bolt 11 may not be used. An electromagnet support frame 20 of Embodiment 2 is a case where the trunnion 32 and the support fixture 10 are coupled together without using the fixing bolt 11.

Figure 5:
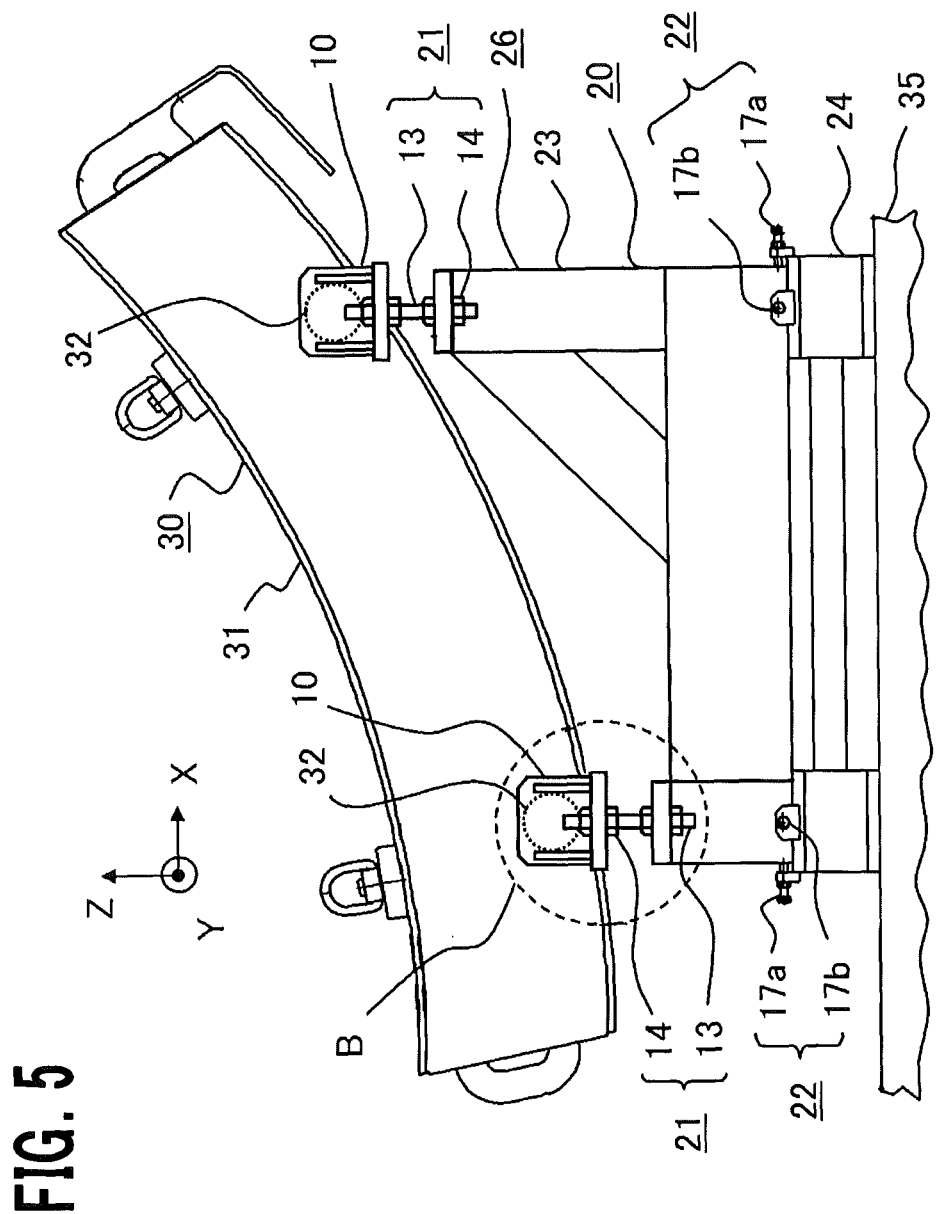
FIG. 5 is a diagram showing an electromagnet support frame according to Embodiment 2 of the invention.
Figure 6:
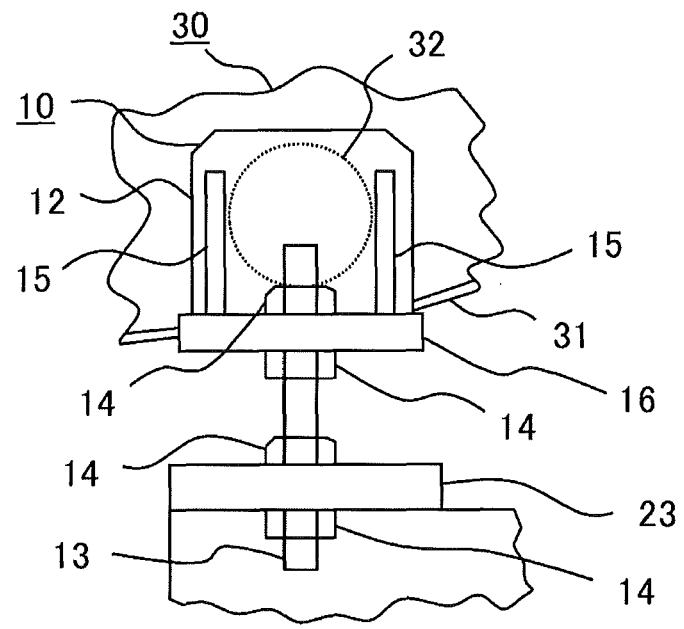
FIG. 6 is an enlarged view of a portion B in FIG. 5.
Figure 7:
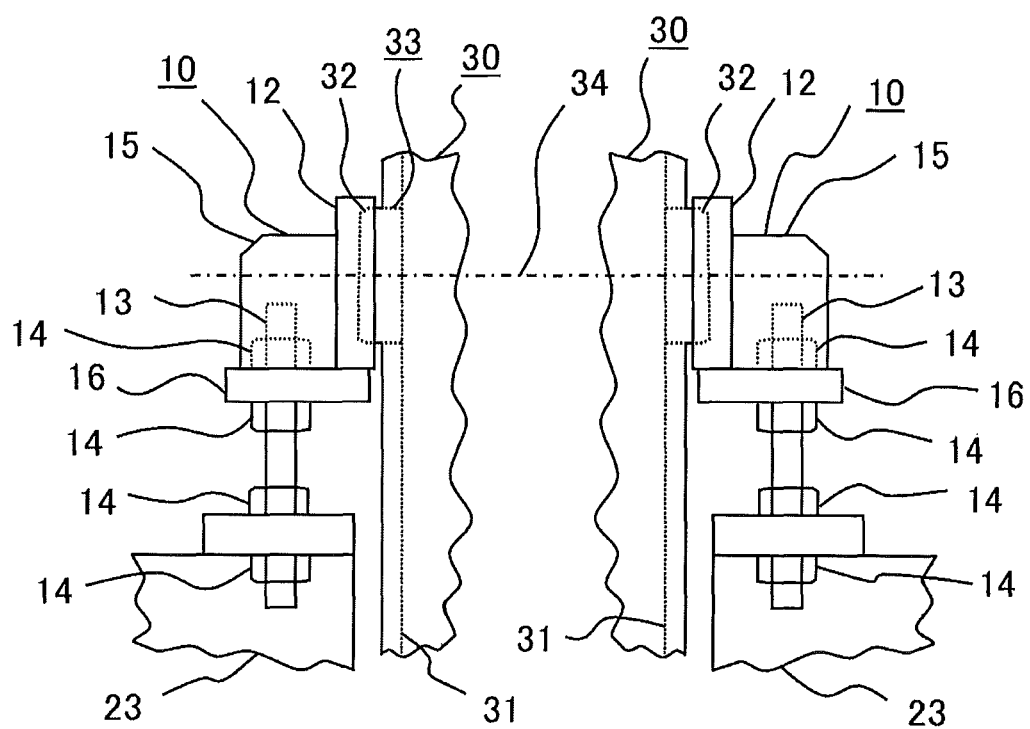
FIG. 7 is a side view of the portion B in FIG. 5.
Figure 8:
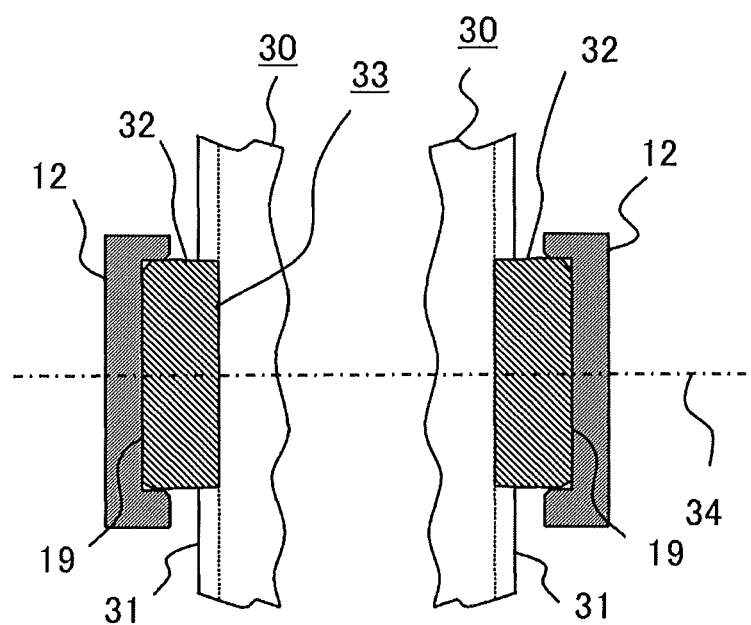
FIG. 8 is a diagram showing an engagement relationship between the electromagnet support frame and the electromagnet according to Embodiment 2 of the invention.

FIG. 5 is a diagram showing the electromagnet support frame according to Embodiment 2 of the invention.
FIG. 6 is an enlarged view of a portion B in FIG. 5, and FIG. 7 is a side view of the portion B in FIG. 5. FIG. 8 is a diagram showing an engagement relationship between the electromagnet support frame and the electromagnet according to Embodiment 2 of the invention, a main-part of which is shown in cross section. The electromagnet support frame 20 of Embodiment 2 differs from that of Embodiment 1 in that it is provided with support fixtures 10 without having the through-holes 18 of Embodiment 1. Further, the trunnions 32 of the electromagnet 30 do not have the screw holes 36 of Embodiment 1.

Since the support fixtures 10 do not have the through-holes 18 of Embodiment 1, the electromagnet support frame 20 of Embodiment 2 is allowed to use the support fixtures 10 having small engaging parts 19, namely, the engaging parts 19 that are small in diameter. Because the electromagnet support frame 20 of Embodiment 2 can make the support fixture 10 smaller than that of Embodiment 1, it is possible to more broadly create an available space around the electromagnet 30 in comparison with Embodiment 1, to thereby further enhance flexibility in arrangement of the electromagnet 30.

Embodiment 3

In Embodiments 1 and 2, description has been made using the case where the trunnions 32 are placed on the electromagnet cover 31 of the electromagnet 30 and the engaging parts 19 are formed on the coupling plates 12; however, the trunnions 32 may be placed on the support fixtures 10, and engaging plates 38 provided with the engaging parts 19 may be placed on the electromagnet cover 31 of the electromagnet 30. The electromagnet support frame 20 of Embodiment 3 is a case where the trunnions 32 are placed on the support fixtures 10, and the engaging plates 38 provided with the engaging parts 19 are placed on the electromagnet cover 31 of the electromagnet 30.

Figure 9:
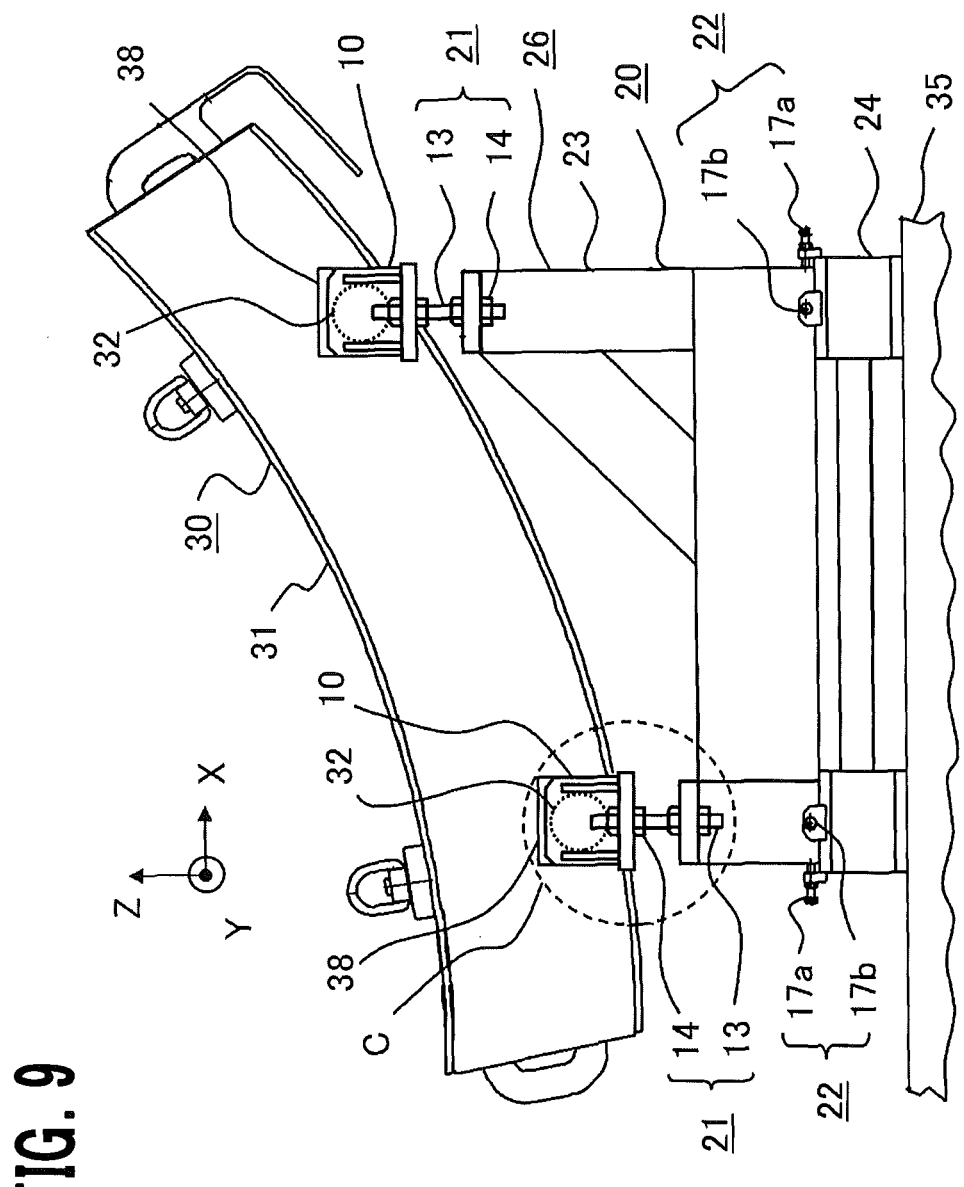
FIG. 9 is a diagram showing an electromagnet support frame according to Embodiment 3 of the invention.
Figure 10:
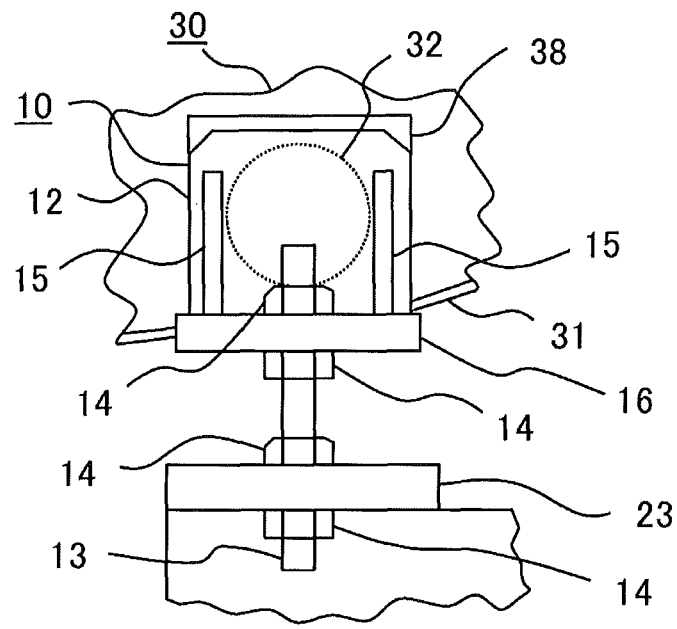
FIG. 10 is an enlarged view of a portion C in FIG. 9.
Figure 11:
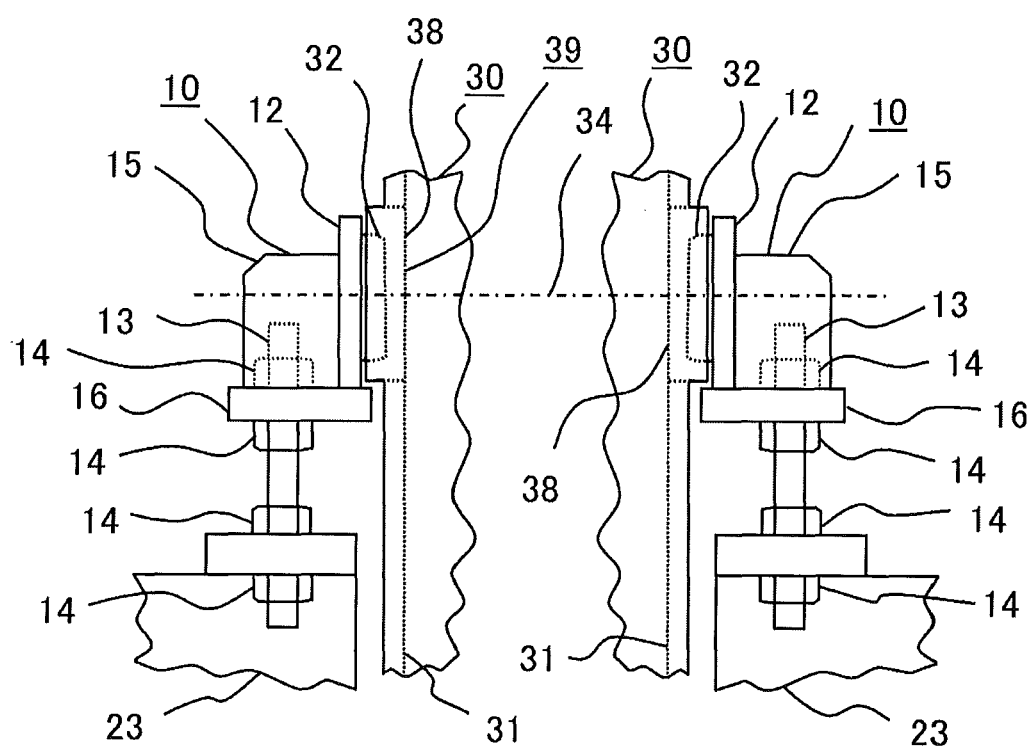
FIG. 11 is a side view of the portion C in FIG. 9.
Figure 12:
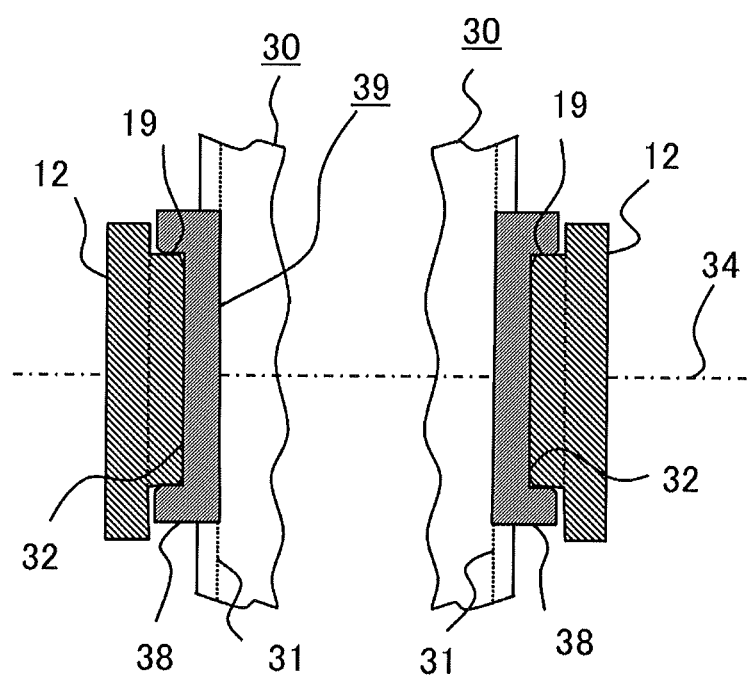
FIG. 12 is a diagram showing an engagement relationship between the electromagnet support frame and the electromagnet according to Embodiment 3 of the invention.

FIG. 9 is a diagram showing the electromagnet support frame according to Embodiment 3 of the invention. FIG. 10 is an enlarged view of a portion C in FIG. 9, and FIG. 11 is a side view of the portion C in FIG. 9. FIG. 12 is a diagram showing an engagement relationship between the electromagnet support frame and the electromagnet according to Embodiment 3 of the invention, a main-part of which is shown in cross section. The electromagnet support frame 20 of Embodiment 3 differs from the electromagnet support frame 20 of Embodiment 2 in that the trunnions 32 are formed on the coupling plates 12 of the support fixtures 10, and the engaging plates 38 provided with the engaging parts 19 that are engaged with the trunnions 32 so as to be fitted therewith are formed on the electromagnet cover 31 of the electromagnet 30. The two engaging plates 38 whose central axes 34 are matched to each other constitute an engaging-plate pair 39, and the two engaging parts 19 whose central axes 34 are matched to each other constitute an engaging-part pair. For example, the engaging parts 19 (first engaging-part pair) of the left-side engaging-plate pair 39 are placed nearer to the incident side of the charged particle beam, and the engaging parts 19 (second engaging-part pair) of the right-side engaging-plate pair 39 are placed nearer to the emission side of the charged particle beam. In the example in FIG. 9, the support fixtures 10 engaged with the engaging parts 19 of the first engaging-part pair are different in vertical position to the support fixtures 10 engaged with the engaging parts 19 of the second engaging-part pair. The electromagnet support frame 20 of Embodiment 3 produces an effect similar to in Embodiment 2.

According to the electromagnet support frame 20 of Embodiment 3, it serves to support the electromagnet 30 having an engaging-part pair (engaging-plate pair 39) which comprises the engaging parts 19 provided as two recesses that are formed on mutually opposite side-faces of the electromagnet and whose central axes 34 are matched to each other; and it includes: the support fixtures 10 whose number is the same as that of the engaging parts 19 and in which the trunnions 32 are formed that are engaged with the engaging parts 19 so that outer surfaces of the trunnions 32 are inserted therein; and the mounting frame 26 that holds the support fixtures 10 through vertical adjustment parts 21 that move the fixtures in a vertical direction. Thus, it is highly flexible in arrangement of the large-size electromagnet and can be made compact as an entire apparatus.

Note that in the electromagnet support frames 20 of Embodiments 1 to 3, description has been made using the cases where the incident angle and the emission angle of the charged particle beam relative to the floor 35 on which the electromagnet 30 is placed, are different to each other; however, the methods of supporting the electro-magnet 30 using the trunnions 32 and the support fixtures 10 of the invention are also applicable to an electromagnet support frame 20 in the case where the incident angle and the emission angle of the charged particle beam are almost the same.

DESCRIPTION OF REFERENCE NUMERALS AND SIGNS

10: support fixture, 13: adjusting screw rod, 14: nut, 19: engaging part, 20: electromagnet support frame, 21: vertical adjustment part, 22: horizontal adjustment part, 23: upper mounting frame, 24: lower mounting frame, 26: mounting frame, 30: electromagnet, 32: trunnion, 33: trunnion pair, 34: central axis, 39: engaging-plate pair.

The invention claimed is:

1. An electromagnet support frame which supports an electromagnet that controls a beam path of a charged particle beam,
wherein the electromagnet has a trunnion pair which comprises two trunnions that are formed on mutually opposite side-faces of the electromagnet and whose central axes are matched to each other;
said electromagnet support frame comprising:
support fixtures whose number is the same as that of the trunnions and in which engaging parts are formed that are engaged with the trunnions so as to cover outer faces thereof; and
a mounting frame that holds the support fixtures through vertical adjustment parts that move the fixtures in a vertical direction.

2. The electromagnet support frame of claim 1, wherein the electromagnet has a first trunnion pair provided as the trunnion pair and placed nearer to an incident side of the charged particle beam and a second trunnion pair provided as the trunnion pair and placed nearer to an emission side of the charged particle beam, and wherein the support fixtures engaged with the trunnions of the first trunnion pair are different in vertical position to the support fixtures engaged with the trunnions of the second trunnion pair.

3. The electromagnet support frame of claim 2, wherein the vertical adjustment parts each have an adjusting screw rod and a nut, so that the vertical position of each of the support fixtures is adjusted by changing a position of the nut relative to the adjusting screw rod.

4. The electromagnet support frame of claim 2, wherein the mounting frame comprises an upper mounting frame, a lower mounting frame, and a horizontal adjustment part that moves the upper mounting frame relative to the lower mounting frame in a horizontal direction.

5. The electromagnet support frame of claim 1, wherein the vertical adjustment parts each have an adjusting screw rod and a nut, so that the vertical position of each of the support fixtures is adjusted by changing a position of the nut relative to the adjusting screw rod.

6. The electromagnet support frame of claim 5, wherein the mounting frame comprises an upper mounting frame, a lower mounting frame, and a horizontal adjustment part that moves the upper mounting frame relative to the lower mounting frame in a horizontal direction.

7. The electromagnet support frame of claim 1, wherein the mounting frame comprises an upper mounting frame, a lower mounting frame, and a horizontal adjustment part that moves the upper mounting frame relative to the lower mounting frame in a horizontal direction.

8. An electromagnet support frame which supports an electromagnet that controls a beam path of a charged particle beam,
wherein the electromagnet has an engaging-part pair which comprises engaging parts provided as two recesses that are formed on mutually opposite side-faces of the electromagnet and whose central axes are matched to each other,
said electromagnet support frame comprising:
support fixtures whose number is the same as that of the engaging parts and in which trunnions are formed that are engaged with the engaging parts so that outer surfaces of the trunnions are inserted therein; and
a mounting frame that holds the support fixtures through vertical adjustment parts that move the fixtures in a vertical direction.

9. The electromagnet support frame of claim 8, wherein the electromagnet has a first engaging-part pair provided as the engaging-part pair and placed nearer to an incident side of the charged particle beam and a second engaging-part pair provided as the engaging-part pair and placed nearer to an emission side of the charged particle beam, and wherein the support fixtures engaged with the engaging parts of the first engaging-part pair are different in vertical position to the support fixtures engaged with the engaging parts of the second engaging-part pair.

10. The electromagnet support frame of claim 9, wherein the vertical adjustment parts each have an adjusting screw rod and a nut, so that the vertical position of each of the support fixtures is adjusted by changing a position of the nut relative to the adjusting screw rod.

11. The electromagnet support frame of claim 9, wherein the mounting frame comprises an upper mounting frame, a lower mounting frame, and a horizontal adjustment part that moves the upper mounting frame relative to the lower mounting frame in a horizontal direction.

12. The electromagnet support frame of claim 8, wherein the vertical adjustment parts each have an adjusting screw rod and a nut, so that the vertical position of each of the support fixtures is adjusted by changing a position of the nut relative to the adjusting screw rod.

13. The electromagnet support frame of claim 8, wherein the mounting frame comprises an upper mounting frame, a lower mounting frame, and a horizontal adjustment part that moves the upper mounting frame relative to the lower mounting frame in a horizontal direction.

* * * * *